(12) United States Patent
Pernici et al.

(10) Patent No.: US 7,280,066 B2
(45) Date of Patent: Oct. 9, 2007

(54) SINGLE-LOOP SWITCHED-CAPACITOR ANALOG-TO-DIGITAL SIGMA-DELTA CONVERTER

(75) Inventors: Sergio Pernici, Bergamo (IT); Federico Garibaldi, Arcore (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/423,200

(22) Filed: Jun. 9, 2006

(65) Prior Publication Data

US 2006/0279449 A1   Dec. 14, 2006

(30) Foreign Application Priority Data

Jun. 9, 2005   (EP)   ................... 05425416

(51) Int. Cl.
*H03M 1/12* (2006.01)

(52) U.S. Cl. .................. 341/172; 341/143; 341/155

(58) Field of Classification Search ................. 341/172
See application file for complete search history.

(56) References Cited

U.S. PATENT DOCUMENTS

| | | | | |
|---|---|---|---|---|
| 5,001,725 | A * | 3/1991 | Senderowicz et al. ...... | 375/247 |
| 5,030,954 | A * | 7/1991 | Ribner .................. | 341/172 |
| 5,057,839 | A * | 10/1991 | Koch .................... | 341/143 |
| 5,068,659 | A * | 11/1991 | Sakaguchi ............... | 341/143 |
| 5,392,043 | A * | 2/1995 | Ribner .................. | 341/143 |
| 6,172,630 | B1 * | 1/2001 | Nelson .................. | 341/143 |
| 6,184,811 | B1 * | 2/2001 | Nagari et al. ........... | 341/143 |
| 2002/0003485 | A1 * | 1/2002 | Aunio ................... | 341/143 |

OTHER PUBLICATIONS

Rombouts et al., Design of Double-Sampling ΣΔ Modulation A/D Converters with Billinear Integrators, IEEE Transactions on Circuits and Systems I: Fundamental Theory and Applications, vol. 52, No. 4, Apr. 4, 2005, pp. 715-722.

Bazarjani et al., A 40 MHz IF fourth-order Double-Sampled SC Bandpass ΣΔ Modulator, Circuits and Systems, 1997, Proceedings of 1997 IEEE International Symposium on Hong Kong, Jun. 9-12, 1997, vol. 1, pp. 73-76.

\* cited by examiner

*Primary Examiner*—Khai M. Nguyen
(74) *Attorney, Agent, or Firm*—Lisa K. Jorgenson; Allen, Dyer, Doppelt, Milbrath & Gilchrist, P.A.

(57) ABSTRACT

A single-loop differential switched-capacitor sigma-delta converter has a three stage double-sampling architecture with reduced current consumption. The converter is stable for large input dynamics, which makes it suitable for RF applications. The three-stage multi-bit double-sampled architecture has a single-loop architecture in which all integrators are included in a same feedback loop. This has been made possible based upon the type of integrators that are connected in cascade. Functioning of the converter is less sensitive to nonlinearities of the operational amplifiers of the integrators.

25 Claims, 6 Drawing Sheets

SINGLE-LOOP SWITCHED-CAPACITOR ANALOG-TO-DIGITAL SIGMA-DELTA CONVERTER

FIELD OF THE INVENTION

The present invention relates to analog-to-digital converters, and more particularly, to a single-loop switched-capacitor sigma-delta converter with reduced sensitivity to component tolerances and with very good performance in terms of signal-to-noise ratios.

BACKGROUND OF THE INVENTION

Analog-to-digital sigma-delta converters of different topologies have been devised and described in numerous publications. Most of the studies focus on single-loop topologies either with single or multi-bit quantizers, the filter transfer function of which ranges from the second to the fifth order.

In voice and audio applications, sigma-delta converters may be classified as a sigma-delta converter of up to the second order, or a sigma-delta converter of order greater than 2.

For sigma-delta converters of up to the second order, they are hardly used in audio applications because of the presence of idle tones due to pattern noise for low DC voltages. Moreover, they require a large over-sampling factor (OSF>128).

For sigma-delta converters of order greater than 2, they are often used in high fidelity audio applications for high signal-to-noise ratio values. It is rather difficult to make them stable because of the non-linearity that is intrinsically present in the loop. A large signal-to-noise ratio (SNR), a low OSF and low idle tones are peculiar features of these converters.

The article by R. W. Adams et al., "Theory and Practical Implementation of a Fifth-Order Sigma-Delta A/D Converter", J. Audio Eng. Soc., Vol. 39, No. 7/8, July/August 1991, discloses a converter with an 18-bit, fifth order, simple-sampled, single-loop, inverse Chebyshev filter topology plus an integrator reset. The main features of this architecture are a fifth order converter, a high signal-to-noise ratio, and a relatively small over-sampling factor.

Unfortunately, this type of converter is burdened with the following drawbacks. It is not a double-sampled architecture. Consequently, there is a very high current consumption because the sampling frequency is twice that needed in a double-sampled architecture. Moreover, the operational amplifiers of the converter need to be designed accurately because they need to have a wide operating frequency band.

Other drawbacks are that the converter is not intrinsically stable. As a result, stability needs to be ensured by an external resetting of the floating nodes of the circuit. The converter also needs external digital circuitry to reset the floating nodes. As a result, there is an increase of silicon area occupation and in the design complexity.

A basic scheme of a multi-bit sigma-delta converter and a detailed circuit architecture of another second-order double-sampled sigma-delta converter for audio applications, as disclosed in European patent application EP 901,233, are depicted in FIGS. 1 and 2. The European patent application is assigned to the current assignee of the present invention, and is hereby incorporated by reference in its entirety.

Different from the scheme of FIG. 1, the sigma-delta converter of FIG. 2 does not have a multi-bit (N) quantizer (Q). However, it does have a comparator and a D-type flip-flop, which is practically a one-bit quantizer. The switched-capacitor structures are controlled by control signals, the active phases of which are non-overlapping.

This type of converter has the following advantages. It is suitable for audio or simple RF (radio-frequency) applications. It has a limited current consumption because of the double sampling approach, and is fully floating. Thus, there is no in-band folding of high frequency noise due to a mismatch. Unfortunately, a second order single bit topology is unsuitable for most RF applications because of a low signal-to-noise ratio with a broad input frequency band (2 MHz for the WCDMA standard).

Another converter is disclosed in the paper by C. Pinna et al., "A CMOS 64 MSps 20 mA 0.85 mm² Baseband I/Q Modulator Performing 13 bits over 2 MHz Bandwidth". It is based on a 211 Mash architecture and is depicted in FIGS. 3 and 4. This converter has a first two-stage loop that generates the digital signal Y1 and two single-stage loops that generate the signals Y2 and Y3.

The converter has good performance at the cost of an accurate design and realization of dedicated digital blocks to process intermediate signals, and to provide the required synchronization. The output Y is generated by combining the output Y1 of a multi-bit quantizer with the outputs Y2 and Y3 from the two auxiliary blocks of the single-stage loops. The study of stability is greatly simplified because of the multi-bit quantizer, and more accurately approaches the ideal linear behavior. In contrast, the Adams et al. converter does not have a multi-bit quantizer, and stability is a more difficult task.

Of course, multi-loop topologies ensure stability, but they need to be properly designed and the loops need to be accurately synchronized.

Another advantage of using a multi-bit quantizer includes a wider dynamic input range of the converter than in similar topologies that use a single-bit quantizer. However, this converter is relatively sensitive to capacitor mismatches and to nonlinearities of the operational amplifiers. This is a significant drawback in audio applications and in high performance cellular phones where a high SNR is required.

SUMMARY OF THE INVENTION

In view of the foregoing background, an object of the present invention is to provide a single-loop differential switched-capacitor sigma-delta converter with outstanding performance in terms of signal-to-noise ratio, and is also relatively not sensitive to component tolerances, such as mismatches between switched capacitors or nonlinearity of its operational amplifiers.

This and other objects, features and advantages in accordance with the present invention are provided by a converter comprising a three stage double-sampling architecture with a reduced current consumption, and is stable even for large input dynamics. The latter characteristic makes it suitable for RF applications.

The three-stage multi-bit double-sampled sigma-delta converter has a single-loop architecture. That is, all integrators are included in a same feedback loop. This has been made possible by properly choosing the type of integrators of the converter connected in cascade. More precisely, the input integrator may be a bilinear integrator (as shown in the figure), or as an alternative, a non-inverting delaying lossless discrete integrator. The second integrator may be an inverting non-delaying lossless discrete integrator. The third integrator may also be a non-inverting delaying lossless discrete integrator. The converter is less sensitive than prior art converters to eventual tolerances of the operational amplifiers of the integrators.

According to a preferred embodiment, the converter may comprise a second differential feedback path. This path may comprise two identical switched-capacitor structures that sample the analog output of the last integrator, and feed it to the input nodes of the operational amplifier of the second integrator in the cascade.

BRIEF DESCRIPTION OF THE DRAWINGS

The invention is described referring to the attached drawings, wherein.

DETAILED DESCRIPTION OF THE PREFERRED EMBODIMENTS

Figure 5:
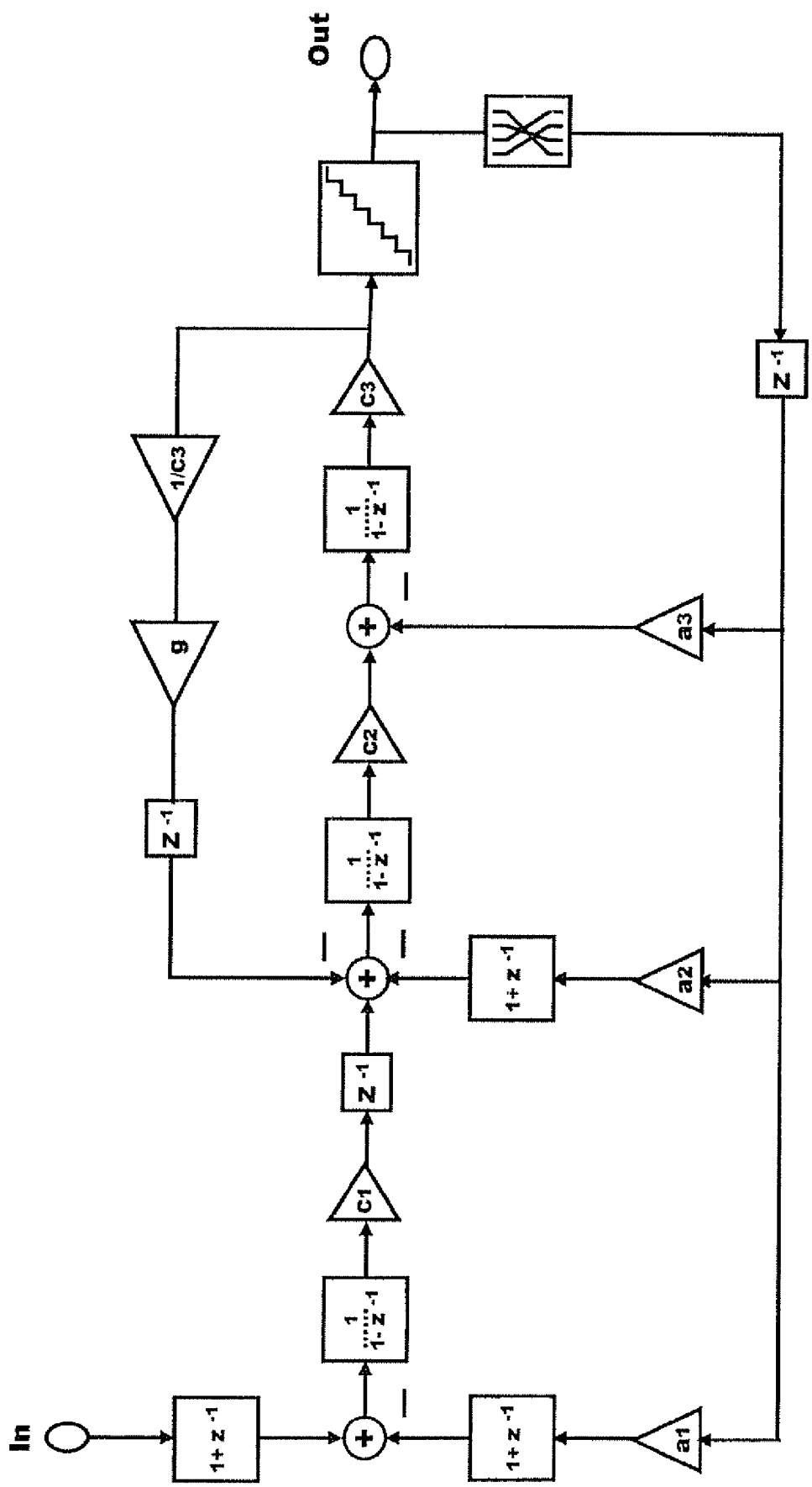
FIG. 5 is a block diagram of a preferred embodiment of a single-loop sigma-delta converter in accordance with the present invention.

A high-level block diagram of an embodiment of the single-loop converter in accordance with the invention is shown in FIG. 5. The converter substantially comprises at least three differential integrators in cascade, the gain of which is $c_1$, $c_2$ and $c_3$, a multi-bit quantizer generating a digital output OUT and digital-to-analog feedback converters, the gain of which is $a_1$, $a_2$ and $a_3$.

The Z-transform of the overall transfer function of the preferred embodiment of the converter may be immediately derived from FIG. 5. The first (input) integrator in the cascade has the following bilinear transfer function:

$$\frac{1+z^{-1}}{1-z^{-1}} \cdot c_1$$

It may even have the transfer function of a non-inverting delaying lossless discrete integrator (LDI):

$$\frac{1}{1-z^{-1}} \cdot c_1$$

The second integrator has an inverting non-delaying LDI transfer function:

$$\frac{z^{-1}}{1-z^{-1}} \cdot c_2$$

The third integrator has a non-inverting delaying LDI transfer function:

$$\frac{1}{1-z^{-1}} \cdot c_3$$

Moreover, the transfer functions of the digital-to-analog converters (DAC) coupled to the input to the first and of the second integrator differ from those of the DACs connected to the last integrator in the cascade. An input signal IN is converted into a digital output OUT generated by a multi-bit quantizer, and an analog signal corresponding to the digital output OUT is fed-back to all integrators.

According to a preferred embodiment, a second feedback path $1/c_3$, g, $z^{-1}$ provides the analog output of the last integrator in the cascade as input to the second integrator. This second optional feedback path introduces zeroes in the transfer function of the sigma-delta converter, thus improving its SNR.

In known converters, increasing the sampling frequency to reach a higher performance implies larger and larger current consumption, and imposes on the design of operational amplifiers a relatively high performance. In contrast, the topology of FIG. 5 allows the SNR to be increased without increasing the sampling frequency because of the three-stage approach.

The digital output is generated by a multi-bit quantizer. Thus, it is relatively easy to make the loop stable. Indeed, the gain of the multi-bit quantizer is practically one. Thus, a linear analysis of stability is more accurate than for intrinsically non-linear topologies. The linearity of the loop permits a very precise setting of the coefficients of the feedback paths, that is, the gains $a_1$, $a_2$, $a_3$ of the digital-to-analog converters, the gains $c_1$, $c_2$, $c_3$ of the integrators and (if present) the gain $g/c_3$ of the second optional feedback path.

Figure 1:
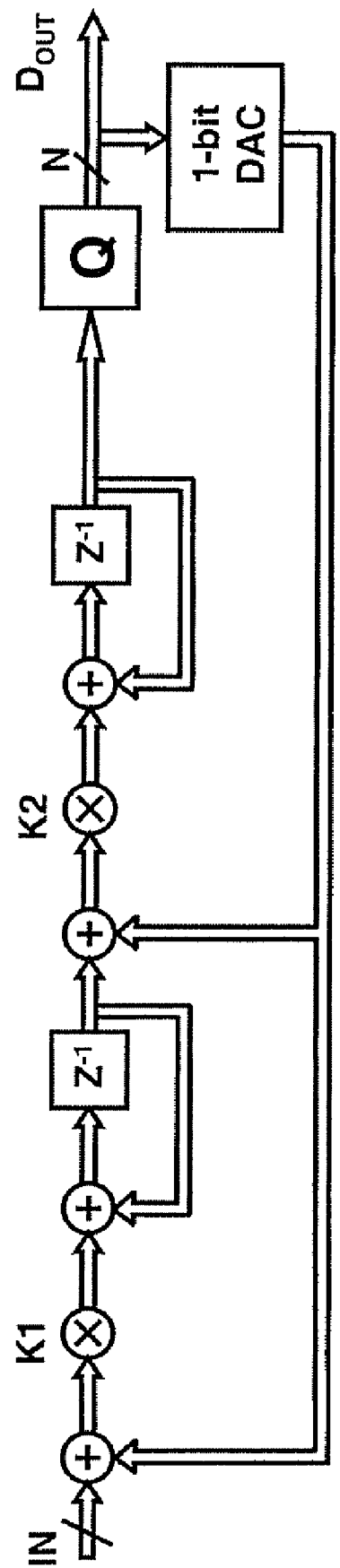
FIGS. 1 and 2 show a second-order single bit double-sampled sigma-delta converter in accordance with the prior art.
Figure 2:
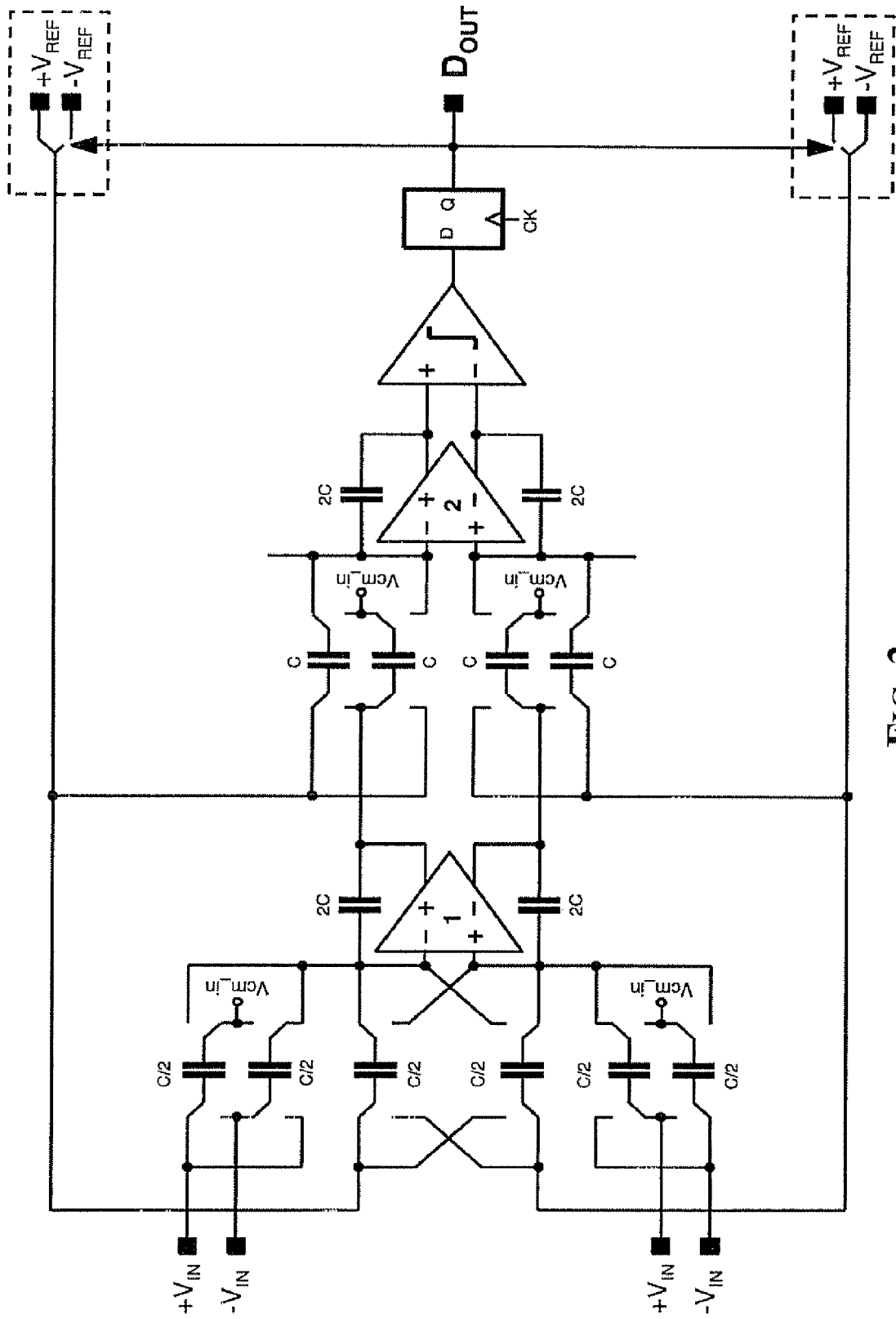

By using a multi-bit architecture instead of a single-bit architecture, as in the converter of FIG. 2, there are significant advantages. Once the sampling frequency has been fixed and the stability performance has been defined, the input dynamic range that is allowed by the multi-bit architecture is larger than that allowed by a single-bit architecture.

Figure 6:
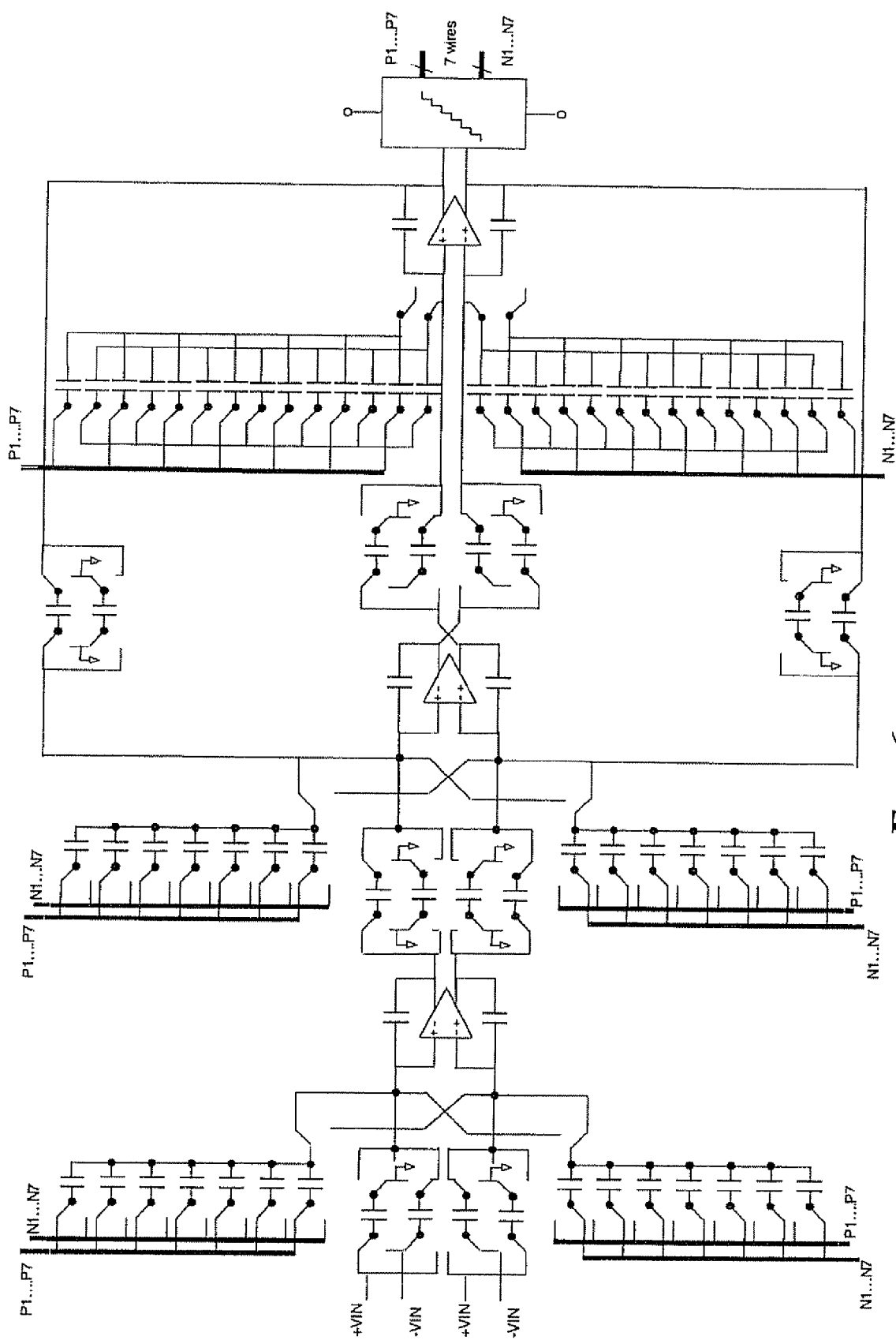
FIG. 6 is a more detailed schematic of a single-loop sigma-delta converter in accordance with the present invention.

A circuit embodiment corresponding to the block diagram of FIG. 5 is shown in FIG. 6. The first integrator in the cascade may be a bilinear integrator (as shown in the figure), or as an alternative, a non-inverting delaying lossless discrete integrator. The second integrator is an inverting non-delaying lossless discrete integrator, and the third is a non-inverting delaying lossless discrete integrator. The second feedback path is composed of a pair of switched-capacitor structures identical to the switched capacitor structure of the second integrator (non-delaying LDI).

The feedback digital-to-analog converters of the first and second integrators are identical to each other, and are substantially composed of arrays of bilinear switched-capacitors coupled to the bits P1 . . . P7 and to the bits N1 . . . N7.

In contrast, each digital-to-analog converter of the last stage is composed of an array of switched-capacitors connected to the bits P1 . . . P7 (N1 . . . N7) and to ground. The capacitors are twice more numerous than the capacitors of the array of the digital-to-analog converters of any of the integrators upstream, and half of them are coupled to the input of the amplifier. The switched-capacitor structure of the digital-to-analog converters connected upstream the amplifier of the last stage forms with it an inverting non-delaying integrator.

Preferably, the bits converted by the feedback digital-to-analog converters assume pre-established positive +$V_{REF}$ or negative −$V_{REF}$ voltage levels, as schematically shown in FIG. 2 for a known converter. These voltages are generated by respective stable voltage generators.

Figure 3:
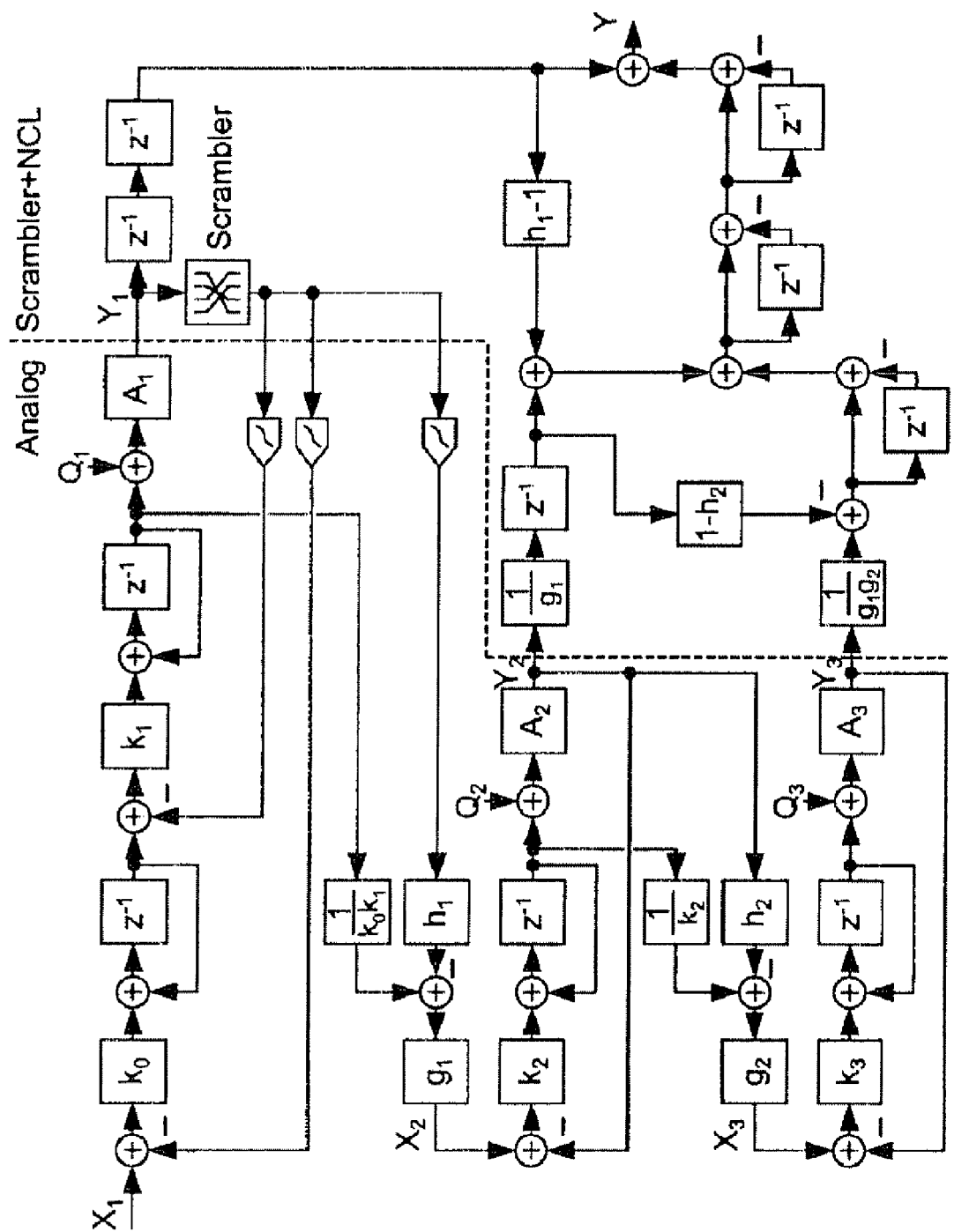
FIGS. 3 and 4 show a double-loop converter with a mash 211 architecture in accordance with the prior art.
Figure 4:
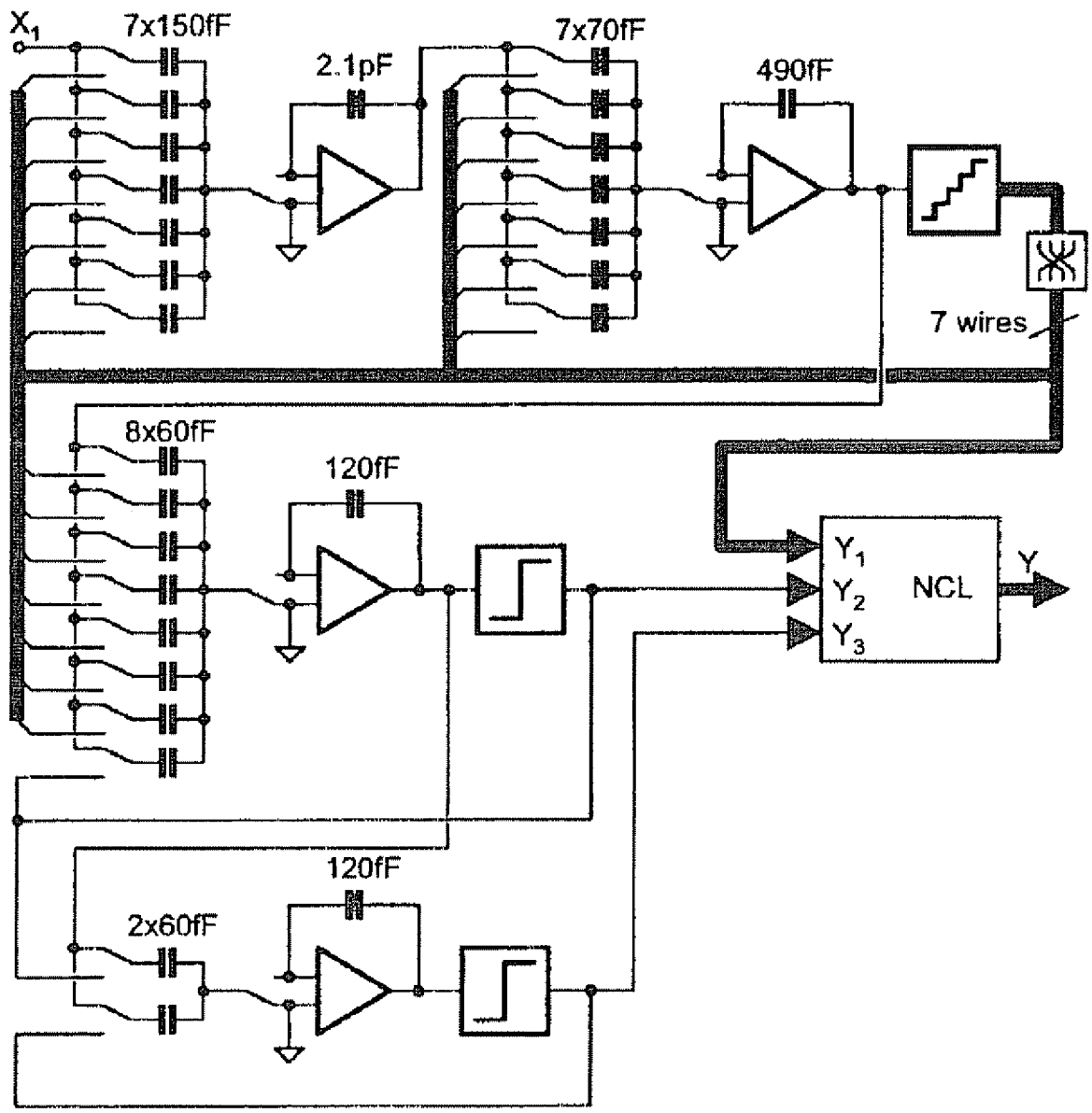

Differently from the mash architecture of FIGS. 3 and 4, all integrators of the converter are in a same feedback loop. The converter has a double-sampled switched-capacitor architecture that makes it appropriate for high performances mobile phone applications.

The negative feedback digital-to-analog converters have a fully floating architecture. That is, these switched capacitors arrays are not referred to a common mode voltage $V_{CM}$. On one side they are alternately switched between the two differential inputs, while on the other side, they are alternately switched between the positive and negative virtual grounds of the operational amplifier. Evidently, the switches of the two sides of each switched-capacitor structure need to be controlled by control signals, the active phases of which are non-overlapping.

The bits of the digital output $O_{UT}$ are converted in corresponding analog signals that may assume one of two pre-established voltage levels +$V_{REF}$, −$V_{REF}$ symmetrical with respect to the common mode voltage $V_{CM}$, as highlighted in the scheme of FIG. 2 of a known converter. Typically, these voltages are generated by band-gap voltage generators.

The double-sampling fully floating architecture of the converter is relatively not sensitive to capacitor mismatches, contrary to "virtual ground" switched-capacitor structures ("Low Voltage Double-sampled $\Sigma$-$\Delta$ Converters", D. Senderowicz et al., JSSC, n. 12, DEC 97), where that could lead to an undesired modulation of high frequency noise in the operating frequency band.

It is worth noting that a full floating switched-capacitor architecture would not work without realizing also a double sampling architecture. Indeed, in a double sampling architecture, the signal is injected by the capacitors into the inputs of the operational amplifier during every conduction phase of the switches. This is while, with a single sampling architecture, conduction phases of the switches during which the signal input to a capacitor is sampled and alternated with conduction phases during which the signal is injected into the amplifier.

According to a preferred embodiment, the analog output of the last integrator in the cascade is double-sampled and fed-back to the inputs of the second integrator through switched-capacitor structures. These switched-capacitor feedback structures, together with the integrators, form an inverse Chebyshev filter (R. W. Adams et al., "Theory and Practical Implementation of a Fifth-Order Sigma-Delta A/D Converter") that introduces zeroes in the transfer function of the converter, thus strongly reducing the in-band noise.

The optimization of the coefficients $a_1$, $a_2$, $a_3$, $c_1$, $c_2$, $c_3$ and g allows the operational amplifiers to generate signals that may reach the level of the supply voltage without making the converter enter an unstable zone of operation. This generates a distortion, but when the conditions that led to saturation are over, the modulator recovers its full functionality.

The converter may have rail-to-rail dynamics without becoming unstable, thus there is no need of dedicated external control circuits to prevent instability. In contrast, in known converters there is either a dedicated digital (0 and 1 counting) or an analog circuit for preventing instability. This implies additional silicon area occupation.

Simulations of the functioning of the converter of FIG. 6 showed that the functioning of the last stage of the converter is not penalized relevantly if the feedback LDI digital-to-analog converters are used instead of bilinear digital-to-analog converters. This is because the impact of capacitor mismatches at this level of the converter does not negatively affect the performance.

The double sampling architecture allows the sampling frequency to be halved, thus reducing current consumptions approximately the same amount and making less restrictive the design of operational amplifiers. In contrast, the Adams et al. approach is intrinsically current wasting and unsuitable for mobile phones.

The architecture of FIG. 6 has the same advantages of multi-loop architectures, but it does not have stringent design constraints. To summarize, the main features of the sigma-delta converter in accordance with the present invention are as follows:

a double-sampling architecture;
a bilinear approach with a full floating architecture;
in-band noise transfer function zeroes;
by properly choosing the coefficients $c_1$, $c_2$, $c_3$, $a_1$, $a_2$, $a_3$ and g it is possible to have a rail-to-rail stability range;
no need of having a dedicated logic to monitor when the output level of the operational amplifiers has reached the supply voltage (order of the converter greater than two); and
multi-bit output;

To summarize, the main advantages of the sigma-delta converter in accordance with the present invention are as follows:

a very simple topology compared to multi-loop architectures;
a double sampling design with reduced current consumption;
high SNR with low OSR;
less restrictive design specifications of the operational amplifiers because of the reduced sampling frequency and the single loop architecture;
increased SNR, increases maximum input range (dynamic range) and simplified stability analysis;
reduced capacitor matching problems; and
stability provided also by saturation of the operational amplifiers.

That which is claimed:

1. A third-order single-loop multi-bit differential analog-to-digital sigma-delta converter comprising:
   a first, second and third differential switched-capacitor integrator coupled in cascade;
   said first differential switched-capacitor integrator receiving as input an analog differential input signal to be converted, said third differential switched-capacitor integrator that is last in the cascade for generating a differential analog output signal, and each differential switched-capacitor integrator comprising a switched-capacitor structure and an operational amplifier coupled thereto;
   a multi-bit quantizer coupled to said third differential switched-capacitor integrator for receiving the differential analog output signal, and generating a corresponding differential digital output signal of the sigma-delta converter; and
   a first, second and third negative feedback digital-to-analog converter respectively coupled between said multi-bit quantizer and said first, second and third differential switched-capacitor integrators, each converter receiving as input the differential digital output signal and feeding an analog replica thereof to an input terminal of said operational amplifier of a corresponding differential switched-capacitor integrator;

each of said negative feedback digital-to-analog converters coupled to said first and second differential switched-capacitor integrators comprising a bilinear switched capacitor array, and said negative feedback digital-to-analog converter coupled to said third differential switched-capacitor integrator comprising a switched-capacitor array for forming with said respective operational amplifier a differential non-inverting delaying switched-capacitor integrator.

2. The converter according to claim 1, wherein said first differential switched-capacitor integrator comprises at least one of a bilinear and a non-inverting delaying switched-capacitor integrator; and wherein said second differential switched-capacitor integrator comprises a non-inverting delaying switched-capacitor integrator.

3. The converter according to claim 1, wherein each differential switched-capacitor integrator comprises a lossless discrete integrator.

4. The converter according to claim 1, wherein each bit of the differential digital output signal assumes one of two voltage levels symmetrical with respect to a fixed common mode voltage; and wherein said switched-capacitor structures are referenced to the common mode voltage.

5. The converter according to claim 1, further comprising a pair of double-sampled switched-capacitor feedback structures identical to those of said second differential switched-capacitor integrator, and coupled between respective output nodes of said third differential switched-capacitor integrator and input nodes of said operational amplifier of said second differential switched-capacitor integrator for double-sampling the differential analog output signal.

6. The converter according to claim 1, wherein said switched-capacitor structures are referenced to a common mode voltage.

7. The converter according to claim 1, wherein said switched-capacitor structures are controlled by two non-overlapping pulse width modulation (PWM) control phases.

8. A sigma-delta converter comprising:
a first, second and third differential switched-capacitor integrator coupled in cascade;
said first differential switched-capacitor integrator receiving as input an analog differential input signal to be converted, and said third differential switched-capacitor integrator for generating a differential analog output signal;
a multi-bit quantizer coupled to said third differential switched-capacitor integrator for receiving the differential analog output signal, and generating a corresponding differential digital output signal of the sigma-delta converter; and
a first, second and third negative feedback digital-to-analog converter respectively coupled between said multi-bit quantizer and said first, second and third differential switched-capacitor integrators, each converter receiving as input the differential digital output signal and feeding an analog replica thereof to a corresponding differential switched-capacitor integrator, and each converter comprising a switched-capacitor array.

9. The converter according to claim 8, wherein each switched-capacitor array coupled to said respective first and second differential switched-capacitor integrators comprises a bilinear switched-capacitor array.

10. The converter according to claim 8, wherein each differential switched-capacitor integrator comprises a switched-capacitor structure and an operational amplifier coupled thereto; and wherein each negative feedback digital-to-analog converter receiving as input the differential digital output signal feeds the analog replica thereof to an input terminal of said operational amplifier of a corresponding differential switched-capacitor integrator.

11. The converter according to claim 8, wherein said first differential switched-capacitor integrator comprises at least one of a bilinear and a non-inverting delaying switched-capacitor integrator; and wherein said second and third differential switched-capacitor integrators each comprises a non-inverting delaying switched-capacitor integrator.

12. The converter according to claim 8, wherein each differential switched-capacitor integrator comprises a lossless discrete integrator.

13. The converter according to claim 10, wherein each bit of the differential digital output signal assumes one of two voltage levels symmetrical with respect to a fixed common mode voltage; and wherein said switched-capacitor structures are referenced to the common mode voltage.

14. The converter according to claim 10, further comprising a pair of double-sampled switched-capacitor feedback structures identical to those of said second differential switched-capacitor integrator, and coupled between respective output nodes of said third differential switched-capacitor integrator and input nodes of said operational amplifier of said second differential switched-capacitor integrator for double-sampling the differential analog output signal.

15. The converter according to claim 10, wherein said switched-capacitor structures are referenced to a common mode voltage.

16. The converter according to claim 10, wherein said switched-capacitor structures are controlled by two non-overlapping PWM control phases.

17. A method for using a sigma-delta converter comprising a first, second and third differential switched-capacitor integrator coupled in cascade; a multi-bit quantizer coupled to the third differential switched-capacitor integrator; and a first, second and third negative feedback digital-to-analog converter coupled between the multi-bit quantizer and the first, second and third differential switched-capacitor integrators, the method comprising:
providing an analog differential input signal that is to be converted to the first differential switched-capacitor integrator;
generating a differential analog output signal from the third differential switched-capacitor integrator that is last in the cascade;
providing the differential analog output signal to the multi-bit quantizer and generating a corresponding differential digital output signal of the sigma-delta converter; and
providing the differential digital output signal as respective inputs to the first, second and third negative feedback digital-to-analog converters, each converter feeding an analog replica of the differential digital output signal to a corresponding differential switched-capacitor integrator, with each converter comprising a switched-capacitor array.

18. The method according to claim 17, wherein each switched-capacitor array coupled to the respective first and second differential switched-capacitor integrators comprises a bilinear switched-capacitor array.

19. The method according to claim 17, wherein each differential switched-capacitor integrator comprises a switched-capacitor structure and an operational amplifier coupled thereto; and wherein each negative feedback digital-to-analog converter receiving as input the differential digital output signal feeds the analog replica thereof to an input terminal of the operational amplifier of a corresponding differential switched-capacitor integrator.

20. The method according to claim 17, wherein the first differential switched-capacitor integrator comprises at least one of a bilinear and a non-inverting delaying switched-capacitor integrator; and wherein the second and third differential switched-capacitor integrators each comprises a non-inverting delaying switched-capacitor integrator.

21. The method according to claim 17, wherein each differential switched-capacitor integrator comprises a lossless discrete integrator.

22. The method according to claim 19, wherein each bit of the differential digital output signal assumes one of two voltage levels symmetrical with respect to a fixed common mode voltage; and wherein the switched-capacitor structures are referenced to the common mode voltage.

23. The method according to claim 19, further comprising a pair of double-sampled switched-capacitor feedback structures identical to those of the second differential switched-capacitor integrator, and coupled between respective output nodes of the third differential switched-capacitor integrator and input nodes of the operational amplifier of the second differential switched-capacitor integrator for double-sampling the differential analog output signal.

24. The method according to claim 19, wherein the switched-capacitor structures are referenced to a common mode voltage.

25. The method according to claim 19, wherein the switched-capacitor structures are controlled by two non-overlapping pulse width modulation (PWM) control phases.

* * * * *